(12) United States Patent
Barak et al.

(10) Patent No.: US 9,219,446 B2
(45) Date of Patent: *Dec. 22, 2015

(54) ANALOG SIGNAL PROCESSING DEVICE FOR PHASED ARRAY ANTENNAS

(71) Applicant: Gilat Satellite Networks Ltd., Petah Tikva (IL)

(72) Inventors: Ilan Barak, Kfar Saba (IL); Borislav Marinov, Sofia (BG); Alexander Kostov, Bourgas (BG); Bojidar Avdjiski, Beli Iskar (BG); Radosvet Arnaudov, Sofia (BG)

(73) Assignee: Gilat Satellite Networks, Ltd., Petah Tikva (IL)

( * ) Notice: Subject to any disclaimer, the term of this patent is extended or adjusted under 35 U.S.C. 154(b) by 0 days.

This patent is subject to a terminal disclaimer.

(21) Appl. No.: 14/042,885

(22) Filed: Oct. 1, 2013

(65) Prior Publication Data

US 2014/0030994 A1 Jan. 30, 2014

Related U.S. Application Data

(63) Continuation of application No. 12/354,024, filed on Jan. 15, 2009, now Pat. No. 8,571,507.

(60) Provisional application No. 61/021,652, filed on Jan. 17, 2008.

(51) Int. Cl.
| H03F 1/02 | (2006.01) |
| H01L 23/66 | (2006.01) |
| H01L 25/16 | (2006.01) |
| H01Q 21/00 | (2006.01) |
| H04B 1/16 | (2006.01) |
| H03H 7/25 | (2006.01) |

(52) U.S. Cl.
CPC ............. *H03F 1/0205* (2013.01); *H01L 23/66* (2013.01); *H01L 25/16* (2013.01); *H01Q 21/0025* (2013.01); *H01Q 21/0087* (2013.01); *H01Q 21/0093* (2013.01); *H04B 1/16* (2013.01); *H01L 2223/6644* (2013.01); *H01L 2924/0002* (2013.01); *H03H 7/25* (2013.01)

(58) Field of Classification Search
USPC ...................... 455/137–147, 273, 276.1, 262; 330/257, 258, 260, 286
See application file for complete search history.

(56) References Cited

U.S. PATENT DOCUMENTS

| 3,593,147 | A | * | 7/1971 | Gurak et al. .................. 455/139 |
| 4,079,318 | A | * | 3/1978 | Kinoshita ..................... 455/139 |
| 4,416,023 | A | * | 11/1983 | Michoff ........................ 455/291 |
| 4,531,234 | A | * | 7/1985 | Bell ........................... 455/247.1 |
| 5,159,288 | A | * | 10/1992 | Ito ................................ 330/289 |
| 6,091,970 | A | | 7/2000 | Dean |
| 6,271,728 | B1 | | 8/2001 | Wallace et al. |
| 7,362,101 | B2 | | 4/2008 | Muftuler et al. |
| 7,477,103 | B2 | | 1/2009 | Brueske et al. |
| 7,791,254 | B1 | | 9/2010 | Gibson et al. |
| 7,840,199 | B2 | * | 11/2010 | Krishnaswamy et al. .... 455/147 |

* cited by examiner

*Primary Examiner* — Junpeng Chen
(74) *Attorney, Agent, or Firm* — Banner & Witcoff, Ltd.

(57) ABSTRACT

A signal processing device includes a device package, processing circuitry and biasing circuitry. The processing circuitry is packaged in the device package and is operative to receive one or more Radio Frequency (RF) input signals from one or more antenna elements via one or more pre-amplifiers that are separate from the device, and to process the RF input signals so as to produce an RF output signal. The biasing circuitry is packaged in the device package and is operative to produce one or more biasing signals for biasing the pre-amplifiers.

17 Claims, 7 Drawing Sheets

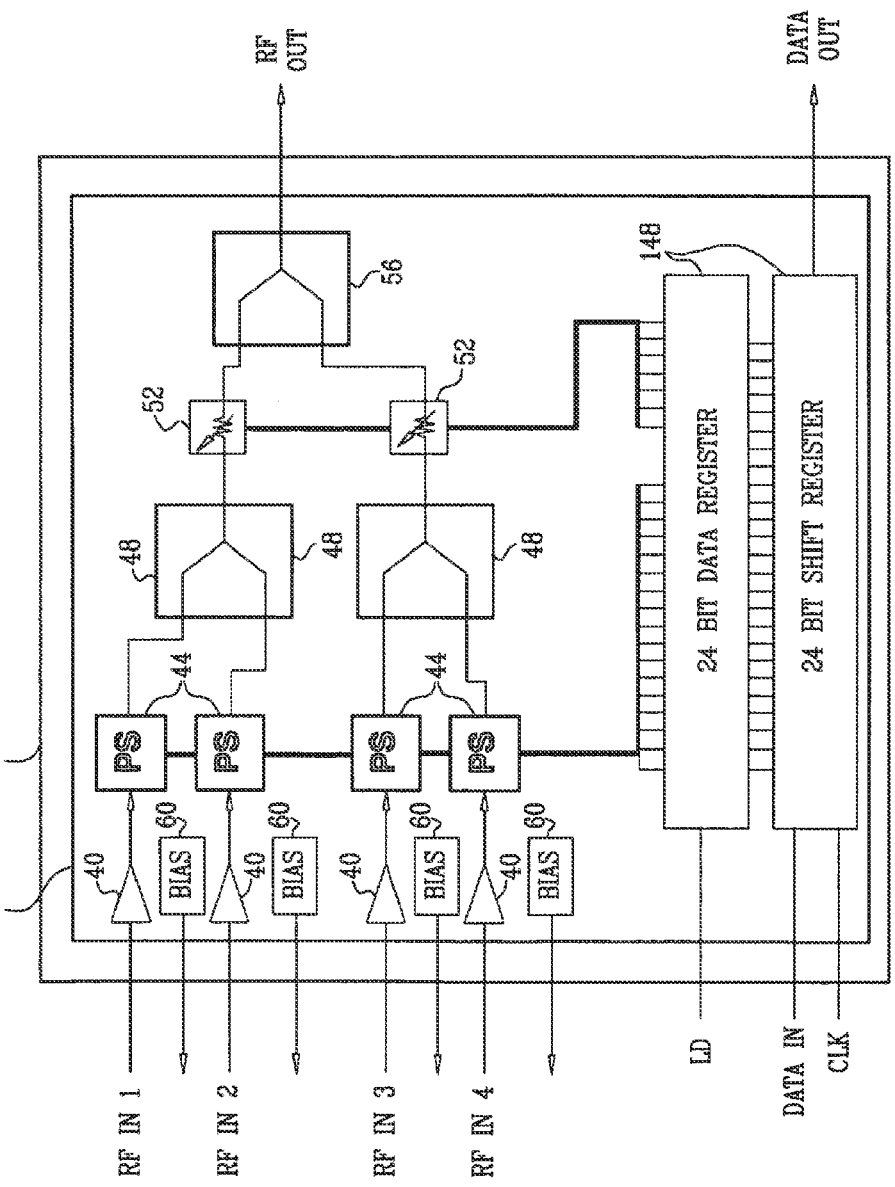

ANALOG SIGNAL PROCESSING DEVICE FOR PHASED ARRAY ANTENNAS

CROSS-REFERENCE TO RELATED APPLICATIONS

This application is a continuation of U.S. patent application Ser. No. 12/354,024, filed Jan. 15, 2009, and entitled "ANALOG SIGNAL PROCESSING DEVICE FOR PHASED ARRAY ANTENNAS," which claims the benefit of U.S. Provisional Patent Application Ser. No. 61/021,652, filed Jan. 17, 2008, and entitled "INTEGRATED ANTENNA PHASED ARRAY CONTROL DEVICE," the disclosures of each of which are incorporated herein by reference in their entirety and made part hereof.

FIELD OF THE INVENTION

The present invention relates generally to antenna systems, and particularly to analog signal processing in phased array antennas.

BACKGROUND OF THE INVENTION

A phased array antenna typically comprises multiple antenna elements, whose outputs are processed and combined to produce an output Radio Frequency (RF) signal. Various methods and devices for processing signals in phased array antennas are known in the art. For example, U.S. Pat. No. 6,556,168, whose disclosure is incorporated herein by reference, describes a phased array antenna having a multi-layered structure in which a number of radiating elements, a phase shift unit and a distribution/synthesis unit are formed on different layers.

U.S. Pat. No. 4,490,721, whose disclosure is incorporated herein by reference, describes a Monolithic Microwave Integrated Circuit (MMIC) that includes an integral array antenna. The system includes radiating elements, a feed network, a phasing network, active and/or passive semiconductor devices, digital logic interface circuits and a microcomputer controller simultaneously incorporated on a single semi-insulating Gallium-Arsenide (GaAs) substrate by means of a controlled fabrication process sequence.

U.S. Patent Application Publication 2003/0107517, whose disclosure is incorporated herein by reference, describes an antenna beam control system, in which four antenna elements are connected to first signal processing circuits, to which phase shift circuits are connected. Output signals from the phase shift circuits are combined by a combiner, a combined signal is processed by a second signal processing circuit, and phase shift amounts in the phase shift circuits are controlled in accordance with strength information of the signal processed in the second signal processing circuit. In some embodiments, the antenna beam control system is realized by an Integrated Circuit (IC) chip.

PCT International Publication WO 2005/050776, whose disclosure is incorporated herein by reference, describes a phased array receiver, which is fabricated on a single silicon substrate. The phased array receiver receives a 24 GHz signal and includes eight elements formed in a SiGe BiCMOS technology. The receiver utilizes a heterodyne topology, and signal combining is performed at an IF of 4.8 GHz.

SUMMARY OF THE INVENTION

An embodiment of the present invention provides a signal processing device, including:

a device package;

processing circuitry, which is packaged in the device package and is operative to receive one or more Radio Frequency (RF) input signals from one or more antenna elements via one or more pre-amplifiers that are separate from the device, and to process the RF input signals so as to produce an RF output signal; and biasing circuitry, which is packaged in the device package and is operative to produce one or more biasing signals for biasing the pre-amplifiers.

In some embodiments, the device includes a semiconductor substrate, and the processing circuitry and the biasing circuitry are fabricated on the semiconductor substrate. In an embodiment, the semiconductor substrate includes a Gallium Arsenide (GaAs) substrate, and the processing circuitry fabricated on the GaAs substrate is operative to receive and process at least four RF input signals. In another embodiment, the processing circuitry is operative to receive the RF input signals from the pre-amplifiers over RF input conductors, and the biasing circuitry is operative to provide at least one of the biasing signals to the pre-amplifiers over at least one of the RF input conductors.

In a disclosed embodiment, the RF input signals include at least first and second RF input signals, the processing circuitry includes at least first and second programmable gain stages, which are configured to modify respective first and second amplitudes of the first and second RF input signals by first and second factors so as to produce respective first and second modified RF signals, and each of the first and second factors is selectable from a respective predefined set of non-uniformly-spaced factors.

In another embodiment, the processing circuitry includes at least one digitally-controlled component, and the device includes digital control circuitry, which is operative to control the at least one digitally-controlled component. In yet another embodiment, the digital control circuitry produces one or more control bits for controlling the at least one digitally-controlled component, and the digital control circuitry is connected to the processing circuitry by control lines, such that each of the control bits is provided to the processing circuitry over only a single control line.

In still another embodiment, the at least one digitally-controlled component includes at least one component type selected from a group of types consisting of a digitally-controlled phase shifter and a digitally-controlled gain stage. In an embodiment, the digital control circuitry includes at least one Serial-to-Parallel (S/P) shift register. In a disclosed embodiment, the processing circuitry is fabricated on a first semiconductor substrate, and the digital control circuitry is fabricated on a second semiconductor substrate, different from the first substrate. Alternatively, the processing circuitry and the digital control circuitry may be fabricated on a common semiconductor substrate.

In some embodiments, the processing circuitry is coupled to receive and process a first subset of the RF input signals that correspond to respective vertically-polarized signals received by the antenna elements, and a second subset of the RF input signals that correspond to respective horizontally-polarized signals received by the antenna elements. In an embodiment, the processing circuitry includes first and second programmable gain stages and is operative to combine the RF input signals in the first subset to produce a first composite signal, to combine the RF input signals in the second subset to produce a second composite signal, to modify an amplitude of the first composite signal using the first programmable gain stage and to modify the amplitude of the second composite signal using the second programmable gain stage.

There is additionally provided, in accordance with an embodiment of the present invention, a signal processing device, including:

first and second programmable gain stages, which are configured to modify respective first and second amplitudes of first and second radio Frequency (RF) input signals by first and second factors so as to produce respective first and second modified RF signals, wherein each of the first and second factors is selectable from a respective predefined set of non-uniformly-spaced factors; and a combiner, which is operative to combine the first and second modified RF signals to produce an RF output signal.

There is also provided, in accordance with an embodiment of the present invention, an antenna system, including:

one or more antenna elements, which are operative to receive Radio Frequency (RF) signals;

one or more pre-amplifiers, which are operative to amplify the RF signals received by the antenna elements to produce RF input signals; and a signal processing device, including:
a device package;
processing circuitry, which is packaged in the device package and is operative to process the RF input signals produced by the pre-amplifiers so as to produce an RF output signal; and
biasing circuitry, which is packaged in the device package and is operative to produce one or more biasing signals for biasing the pre-amplifiers.

There is further provided, in accordance with an embodiment of the present invention, an antenna system, including:

one or more antenna elements, which are operative to receive at least first and second Radio Frequency (RF) input signals having respective first and second amplitudes; and a signal processing device, including:
first and second programmable gain stages, which are respectively configured to modify the first and second amplitudes of first and second radio Frequency (RF) input signals by first and second factors so as to produce respective first and second modified RF signals, wherein each of the first and second factors is selectable from a respective predefined set of non-uniformly-spaced factors; and a combiner, which is operative to combine the first and second modified RF signals to produce an RF output signal.

The present invention will be more fully understood from the following detailed description of the embodiments thereof, taken together with the drawings in which:

BRIEF DESCRIPTION OF THE DRAWINGS

FIG. 8 is a block diagram that schematically illustrates an ASP device, in accordance with an alternative embodiment of the present invention.

DETAILED DESCRIPTION OF EMBODIMENTS

Overview

Embodiments of the present invention provide Analog Signal Processing (ASP) devices for use in phased array antenna systems. The ASP devices described herein receive Radio Frequency (RF) input signals from respective antenna elements, apply amplification, gain control and phase shifting operations to the input signals, and combine the processed signals to produce an RF output signal.

The disclosed ASP devices can be used, for example, in phased array antennas of mobile satellite terminals for television reception. Since many of the applications of such ASP devices are cost-sensitive, the ASP devices described herein apply various measures for reducing the cost and complexity of the device.

For example, in a typical application, a given ASP device receives the RF input signals from the antenna elements via respective low-noise pre-amplifiers that are external to the ASP device. In some embodiments, the ASP device comprises biasing circuitry that provides bias voltages or currents to the external pre-amplifiers. In particular, the biasing voltages or currents may be provided to the pre-amplifiers over the same conductors that are used for providing the input RF signals from the pre-amplifiers to the device. As a result, the pin count of the device is reduced.

In some disclosed device configurations, the ASP device comprises two step-attenuators or other programmable gain stages, which modify the amplitude of respective RF input signals before they are combined to form the RF output signal. Each step-attenuator applies an attenuation level that is selectable from a set of possible attenuation levels. In some embodiments, the set of possible attenuation levels is spaced non-uniformly across the overall attenuation range. Proper selection of the possible attenuation level values enables the ASP device to achieve high accuracy in combining the two RF input signals, while reducing the number of bits of the step-attenuators.

Typically, the ASP device comprises digitally-controlled components, such as phase shifters and step-attenuators, which contain RF switches that are controlled by control lines. In some embodiments, each RF switch is controlled by only a single control line, thus considerably simplifying the control circuitry of the device. Several examples of RF switch configurations that use only a single control line per bit are described herein.

In summary, the ASP device configurations described herein reduce the cost and size of phased array antenna systems.

System Description

Figure 1:
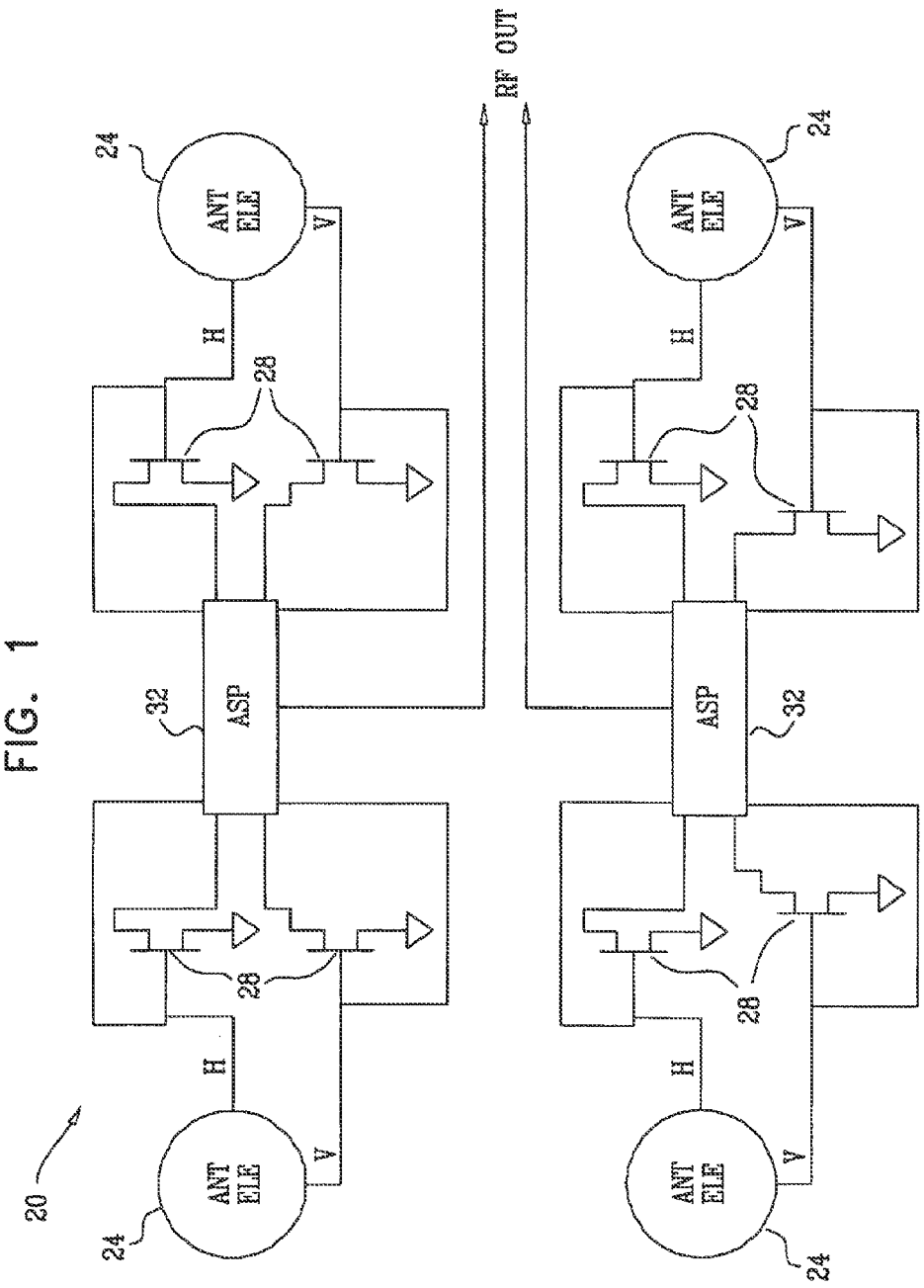
FIG. 1 is a block diagram that schematically illustrates a module of a phased array antenna system, in accordance with an embodiment of the present invention.

FIG. 1 is a block diagram that schematically illustrates a module 20 of a phased array antenna system, in accordance with an embodiment of the present invention. Module 20 comprises four antenna elements 24, as well as circuitry for processing the signals received by these elements. In a typical phased array antenna system, two or more modules 20 are combined to form a planar array having multiple antenna elements.

In the example of FIG. 1, elements 24 comprise patch antenna elements, although any other suitable type of antenna elements can also be used. Each antenna element 24 produces two Radio Frequency (RF) signals, which typically correspond to two signals having mutually-orthogonal polarizations that are received by the antenna element. In the present example, each element produces a horizontally-polarized signal (denoted H) and a vertically-polarized signal (denoted V).

The signals produced by elements 24 are amplified by low-noise pre-amplifiers 28, which in the present example comprise Pseudomorphic High-Electron Mobility Transistor (pHEMT) devices. The pre-amplified signals produced by pre-amplifiers 28 are further processed by Analog Signal Processing (ASP) devices 32. ASP devices 32 typically comprise Monolithic Microwave Integrated Circuits (MMICs). Several example configurations of such MMICs and their components are described hereinbelow.

In the present example, each device 32 receives as input four signals produced by two dual-polarized antenna elements, and processes these signals to produce an RF output signal. In alternative embodiments, however, devices operating on similar principles may accept as input any suitable number of RF input signals, which originate from any suitable number of antenna elements of any kind.

Figure 5:
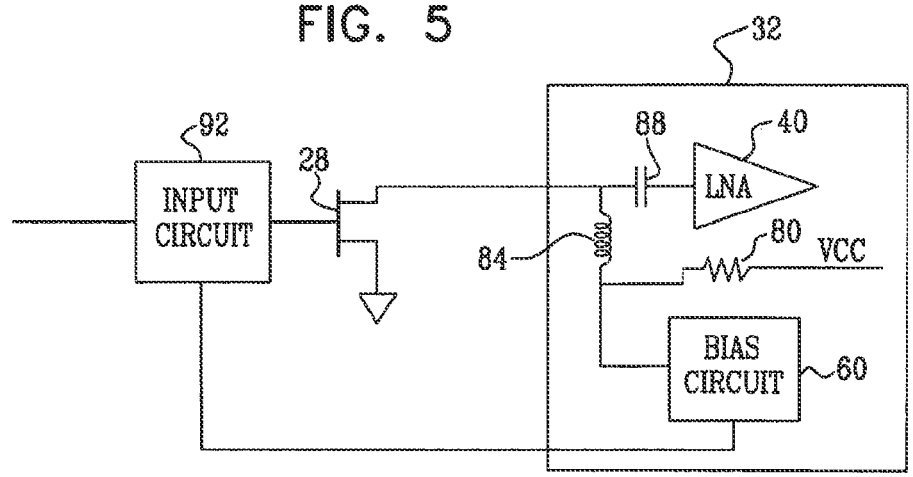
FIG. 5 is a circuit diagram that schematically illustrates biasing circuitry for a pre-amplifier, in accordance with an embodiment of the present invention.

In some embodiments, ASP 32 provides one or more bias voltages or currents to pre-amplifiers 28. In an embodiment, the bias voltages or currents are supplied to the pre-amplifiers over the same conductors that are used for providing the RF input signals from the pre-amplifiers to the ASP device. This feature reduces the pin count of the ASP device. An example configuration of this sort is shown in FIG. 5 below.

Figure 2:
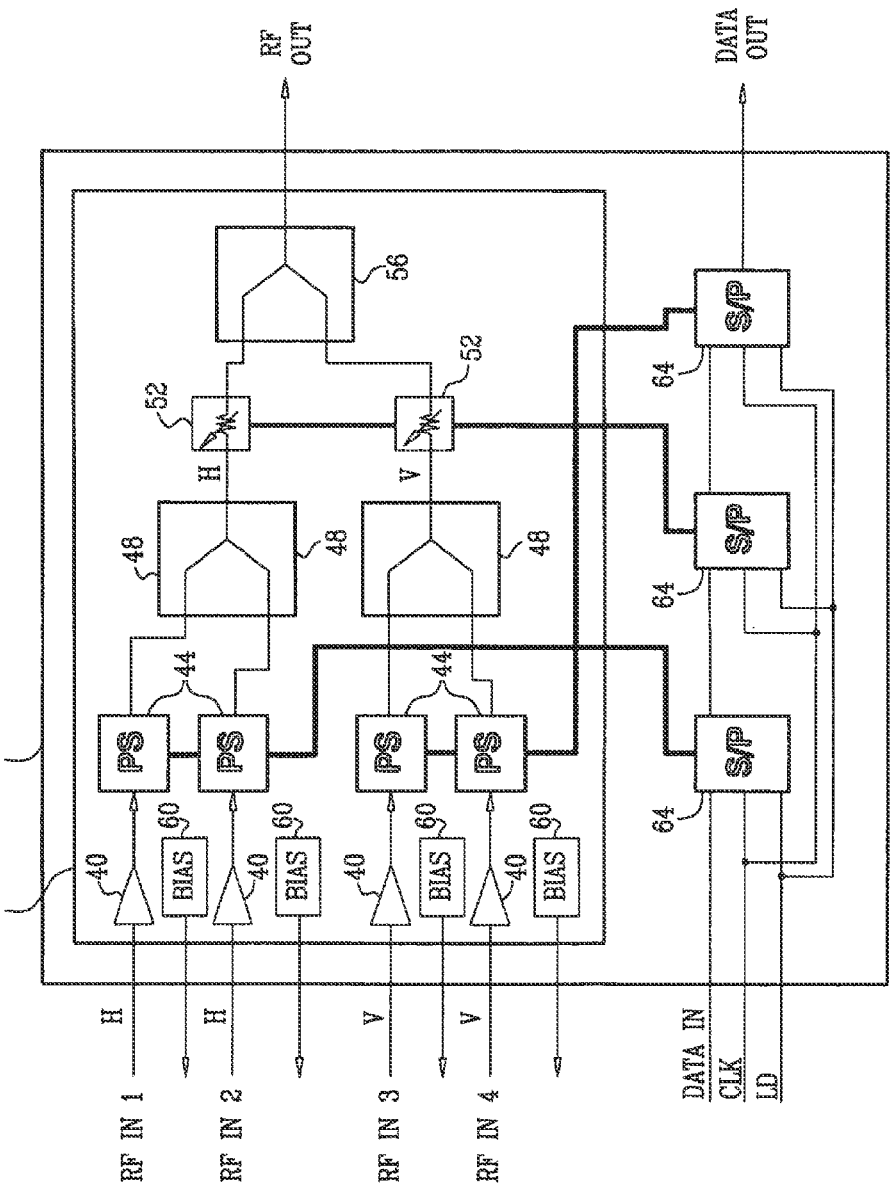
FIG. 2 is a block diagram that schematically illustrates an Analog Signal Processing (ASP) device for use in a phased array antenna system, in accordance with an embodiment of the present invention.

FIG. 2 is a block diagram that schematically illustrates the internal configuration of ASP device 32, in accordance with an embodiment of the present invention. In the example of FIG. 2, device 32 comprises a Multi-Chip Module (MCM), which comprises RF processing circuitry that is fabricated on a substrate 36, and control circuitry that is external to the substrate. Substrate 36 may comprise any suitable type of semiconductor substrate, such as a Gallium-Arsenide (GaAs) substrate. In some embodiments, the different processing elements disposed on substrate 36 are implemented using depletion-mode transistors. Substrate 36 may be fabricated using a depletion-mode pHEMT process.

The control circuitry may comprise one or more Integrated Circuits (ICs) of any kind, such as Complementary Metal Oxide Semiconductor (CMOS) devices. Both the RF circuitry and the control circuitry are packaged in a single device package, e.g., a ceramic package.

Device 32 accepts as input four RF input signals, denoted RF_IN1, . . . , RF_IN4. Each input signal is amplified by a respective Low-Noise Amplifier (LNA) 40. The output of each LNA 40 is provided to a respective programmable Phase Shifter (PS) 44, which shifts the phase of the signal by a controlled amount that is externally-programmable. In the present example, each phase shifter 44 comprises four selectable phase shift sections, which apply phase shifts of 22.5°, 45°, 90° and 180°. By selectively inserting different sections into the signal path, each phase shifter can apply a configurable phase shift at a resolution of 22.5°. The outputs of the phase shifters are combined in pairs by two power combiners 48.

The output of each power combiner 48 is attenuated by a respective digitally-controlled step-attenuator 52. In some embodiments, step-attenuator 52 has attenuation levels that are non-uniformly spaced over the total attenuation range. Certain aspects and advantages of using non-uniform attenuation levels are addressed in the description of FIGS. 3 and 4 below. The outputs of the two step-attenuators are combined by a power combiner 56, whose output is provided as the RF output of device 32.

In a typical application (e.g., in the configuration of FIG. 1), a given ASP device 32 receives two input signals corresponding to horizontally-polarized received signals, and two other input signals that correspond to vertically-polarized received signals. In these embodiments, each power combiner 48 combines two signals that correspond to the same polarization. For example, the input signals corresponding to the horizontally-polarized received signals can be applied to RF_IN 1 and RF_IN 2, and the input signals corresponding to the vertically-polarized received signals can be applied to RF_IN 3 and RF_IN 4.

Device 32 further comprises bias control circuits 60, which are fabricated on substrate 36. Circuits 60 provide and control bias voltages or currents of pre-amplifiers 28. As noted above, some or all of the bias voltages or currents are provided on the same conductors as the RF input signals, so as to reduce the pin count of device 32.

The setting of the desired phase shift values of phase shifters 44 and of the attenuation levels of attenuators 52 is performed by digital control circuitry, in the present example comprising Serial-to-Parallel (S/P) shift registers 64. Each shift register may comprise a CMOS chip, such as, for example, a 74HC595 device, as is known in the art. In the present example, each shift register 64 has an 8-bit parallel output, i.e., it is able to control eight control lines. The shift registers may be programmed, for example, using a Serial Peripheral Interface (SPI) bus. The digital control circuitry may be fabricated or mounted on an additional substrate, e.g., a Silicon substrate, which is separate from substrate 36 but packaged in the same package. Typically, the two substrates are mounted side by side on a common surface of the package, and are connected to one another by bond wires.

In the present example, each phase shifter 44 comprises a 4-bit phase shifter, and each attenuator 52 comprises a 4-bit step-attenuator. Device 32 is configured such that one 8-bit shift register 64 controls two of phase shifters 44, a second shift register controls the other two phase shifters, and the third shift register controls the two step-attenuators 52. Alternatively, however, any other suitable number and configuration of shift registers can also be used.

The three S/P shift registers are cascaded (i.e., the DATA_OUT line of one shift register serves as the DATA_IN line of the next), and receive the desired settings of the phase shifters and attenuators via a data input line denoted DATA_IN. The DATA_IN line is synchronized to a clock line (denoted CLK). The data is locked in the shift registers using an LD line. The CLK and LD lines are common to all three shift registers.

As noted above, a typical phased array antenna system comprises multiple ASP devices 32. In some embodiments, two or more devices 32 can be controlled using a single set of DATA_IN, CLK and LD lines, by cascading devices 32 in a daisy chain configuration. In such a configuration, the DATA_OUT line of a given device 32 drives the DATA_IN of the next device 32 in the chain. The CLK and LD lines are common to all the shift registers of all the ASP devices in the chain.

In the example of FIG. 2, the S/P shift registers are mounted separately from substrate 36. In alternative embodiments, however, some or all of the elements of the control circuitry can be mounted on the semiconductor die, such as using flip-chip techniques.

Note that in the configuration of device 32, a complete setting of device 32 (comprising four 4-bit phase shifters and two 4-bit step-attenuators) is set using twenty-four control lines (provided by three 8-bit shift registers). In other words, each control bit of a phase shifter or step-attenuator is set by a single control line of the S/P shift register. Such a configuration is in contrast to some known switch configurations, in which each switch is controlled by two control lines that carry the control voltage and its complement. Controlling the phase shifters and step-attenuators using one control line per bit simplifies the control circuitry of device 32 considerably. Example circuit diagrams of RF switches that are controlled by a single control line are provided in FIGS. 6A, 6B and 7 below.

Analog Signal Processing with Non-Uniform Step-Attenuators

Consider a dual-polarized antenna element 24 that is connected to a given ASP device 32. Such a configuration can be viewed as an effective antenna. This effective antenna exhibits a certain polarization inclination angle φ with respect to the horizontal plane, which is given by $$\varphi = \tan^{-1}\left(\frac{E_v}{E_h}\right)$$

wherein $E_v$ and $E_h$ denote the magnitudes of the vertically-polarized and horizontally-polarized signals combined by power combiner 56, respectively. This relation assumes that the received signal is linearly-polarized, and that the phase delays applied to the vertically-polarized and the horizontally-polarized signals are identical.

By modifying the settings of step-attenuators 52, device 32 can be configured to exhibit different polarization inclination angles. The achievable accuracy of setting the polarization inclination angle depends on the accuracy of setting the relative attenuation applied to the vertically-polarized and the horizontally-polarized signals. In other words, the achievable accuracy of setting the polarization inclination angle depends on the accuracy of setting the difference in attenuation between the two step-attenuators 52.

In some embodiments of the present invention, each step-attenuator 52 is programmable to apply a set of possible attenuation levels, which are spaced non-uniformly. Each attenuation level comprises a multiplicative factor, which is applied by a step-attenuator to the RF signal passing through it.

(In the description that follows, the term "non-uniform" refers to gain or attenuation values on a logarithmic scale. Thus, for example, a set of attenuation levels {0 dB, 1 dB, 2 dB, 3 dB, 4 dB, 5 dB, 6 dB and 7 dB} is regarded as uniformly-spaced. A set of attenuation levels {0 dB, 1 dB, 3 dB, 4 dB, 6 dB, 7 dB, 9 dB, 10 dB, . . . } is regarded as non-uniformly spaced.) The set of possible attenuation levels is selected such that the difference in attenuation between the two step-attenuators can be set with high resolution, thus achieving high accuracy in setting the polarization inclination angle. For a given accuracy level and a given overall range of attenuation difference, the use of non-uniformly spaced attenuation levels reduces the number of bits of the step-attenuators.

Figure 3:
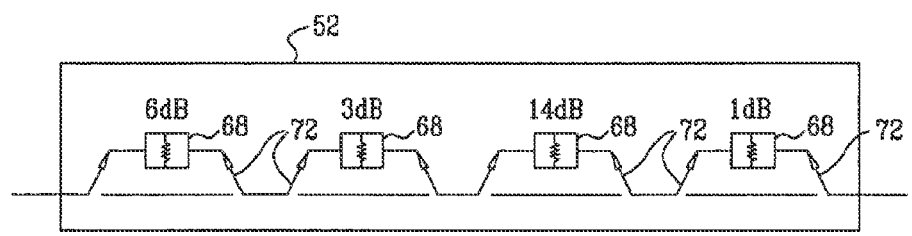
FIG. 3 is a circuit diagram that schematically illustrates a non-uniform step-attenuator, in accordance with an embodiment of the present invention.

FIG. 3 is a circuit diagram that schematically illustrates an example implementation of non-uniform step-attenuator 52, in accordance with an embodiment of the present invention. Attenuator 52 comprises four fixed attenuation stages 68. In the present example, the four stages have attenuation values of 1 dB, 3 dB, 6 dB and 14 dB. (The order in which the stages are placed in the attenuator has no effect on the total attenuation, and the order shown in FIG. 3 is selected based on other considerations, such as phase error sensitivity to variations in source and load VSWR. Each of these stages can be switched into the signal path or bypassed using switches 72. By switching-in and bypassing different attenuation stage combinations, the total attenuation of step-attenuator 52 can be set to a set of values {0 dB, 1 dB, 3 dB, 4 dB, 6 dB, 7 dB, 9 dB, 10 dB, 14 dB, 15 dB, 17 dB, 18 dB, 20 dB, 21 dB, 23 dB, 24 dB}, which is non-uniformly spaced.

The difference in attenuation between two attenuators 52, however, can be set to any desired value between 0 and 24 dB at a resolution of 1 dB, as shown in the following table:

| Attenuation difference (dB) | Attenuator I attenuation level (dB) | Attenuator II attenuation level (dB) |
|---|---|---|
| 0 | 0 | 0 |
| 1 | 1 | 0 |
| 2 | 3 | 1 |
| 3 | 3 | 0 |
| 4 | 3 + 1 = 4 | 0 |
| 5 | 6 | 1 |
| 6 | 6 | 0 |
| 7 | 6 + 3 = 7 | 0 |
| 8 | 6 + 3 = 9 | 1 |
| 9 | 6 + 3 = 9 | 0 |
| 10 | 6 + 3 + 1 = 10 | 0 |
| 11 | 14 | 3 |
| 12 | 14 + 1 = 15 | 3 |
| 13 | 14 | 1 |
| ... | ... | ... |

Achieving a 1 dB resolution in attenuation difference over the range of 0-24 dB using uniformly-spaced attenuators would require 5-bit attenuators instead of the 4-bit attenuators used in device 32.

The achievable resolution of setting the polarization angle determines the cross-polarization error of device 32. Higher resolution provides lower cross-polarization, and vice versa.

Figure 4:
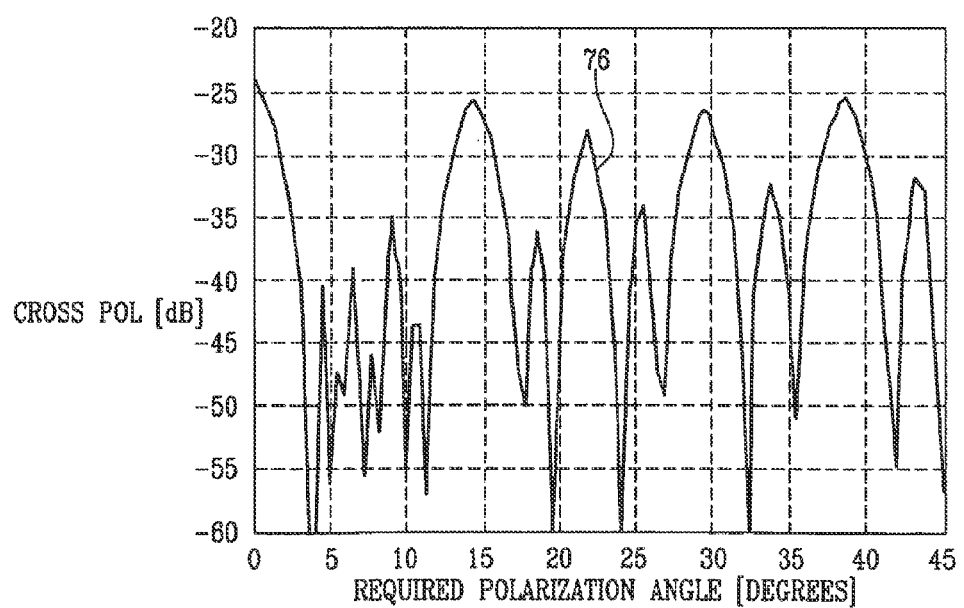
FIG. 4 is a graph showing cross-polarization performance of an ASP device that uses a non-uniform step-attenuators, in accordance with an embodiment of the present invention.

FIG. 4 is a graph showing the simulated cross-polarization performance of ASP device 32 that uses non-uniform step-attenuators 52, in accordance with an embodiment of the present invention. A plot 76 shows the cross-polarization error (in dB) as a function of the desired polarization inclination angle. As can be seen, the 1 dB resolution of setting the attenuation difference between the two step-attenuators produces a cross-polarization error that does not exceed −24 dB.

In the description above, device 32 comprises a step-attenuator per each RF input signal. In alternative embodiments, however, the device may comprise fewer step-attenuators, i.e., it may comprise step-attenuators for attenuating only a subset of the RF input signals. For example, in an embodiment, an ASP device may combine one subset of RF input signals corresponding to vertically-polarized signals, and separately combine another subset of RF input signals corresponding to horizontally-polarized signals. In this embodiment, the ASP device may comprise only two step-attenuators (or other programmable gain stages), one attenuator controlling the composite sum of the vertically-polarized signals and the other controlling the composite sum of the horizontally-polarized signals.

The description above refers to antenna systems that receive linearly-polarized signals. In an antenna system that receives a circularly-polarized signal, each LNA 40 is fed by a respective circularly-polarized antenna element, and attenuators 52 can be omitted.

The embodiments described herein refer mainly to programmable step-attenuators, which apply non-uniformly spaced attenuation levels. Alternatively, however, the ASP devices described herein can also be implemented using programmable amplification stages, which apply non-uniformly spaced positive gains. Both programmable attenuators and programmable amplifier stages are regarded herein as programmable gain stages, which apply non-uniformly spaced gains (i.e., modify the amplitudes of the signals passing through them using non-uniformly spaced factors), which may be positive or negative.

Pre-Amplifier Biasing Circuitry

As noted above, in some embodiments device 32 provides bias voltages or currents to pre-amplifiers 28 over the same conductors that are used for providing the RF input signals from the pre-amplifiers to the device.

FIG. 5 is a circuit diagram that schematically illustrates an example biasing circuitry for pre-amplifier 28, in accordance with an embodiment of the present invention. In the configuration of FIG. 5, bias circuit 60 provides the drain current and the gate voltage to pre-amplifier 28 (a pHEMT in this example). In an embodiment, circuit 60 controls the gate voltage in response to the drain current of the pre-amplifier.

The drain current is provided via a resistor 80 and a bias tee, which comprises an inductor 84 and a capacitor 88. The gate voltage is applied by circuit 60 through a passive input circuit 92. The voltage drop across resistor 80 is proportional to the drain current of pre-amplifier 28, as monitored by bias control circuit 60. In some embodiments, circuit 60 may compare the pre-amplifier drain current to a reference voltage, so as to produce the gate voltage applied to input circuit 92. This configuration causes the pre-amplifier to draw a constant predetermined drain current.

As can be seen, the drain current bias is provided to pre-amplifier 28 via the same line that is used for providing the RF input signal from the pre-amplifier to device 32. In alternative embodiments, device 32 may comprise any other suitable biasing circuitry for providing bias voltages or currents to pre-amplifiers 28.

Switch Control with a Single Control Line Per Bit

In the configuration of FIG. 2 above, each control line at the output of S/P shift registers 64 controls a corresponding bit in one of phase shifters 44 or step-attenuators 52. In order to enable this one-to-one relationship, each internal switch in the phase shifters and step-attenuators should be controllable with only a single control line. Transferring each control bit over only a single control line is especially beneficial when the RF processing circuitry and the control circuitry are disposed on separate semiconductor dies (substrates). In such configurations, each control line uses a bonding pad on each die, and the bonding pads consume die area. Minimizing the number of bonding pads is important in reducing the die area of the ASP device.

Figure 6A:
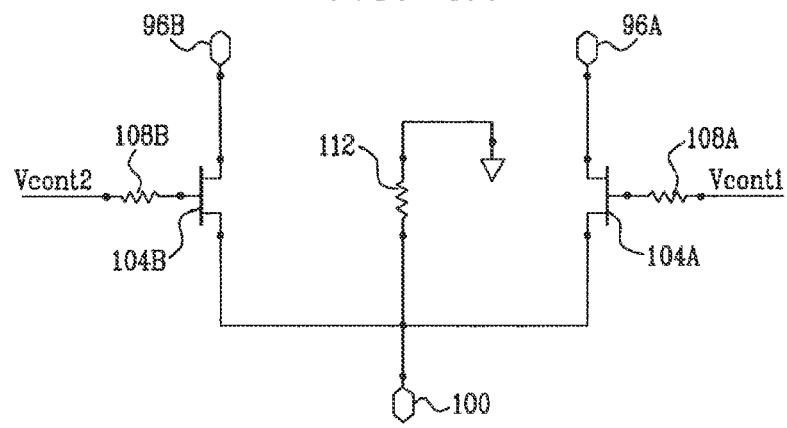
FIGS. 6A, 6B and 7 are circuit diagrams that schematically illustrate switching circuits that use a single control line per bit, in accordance with embodiments of the present invention.
Figure 6B:
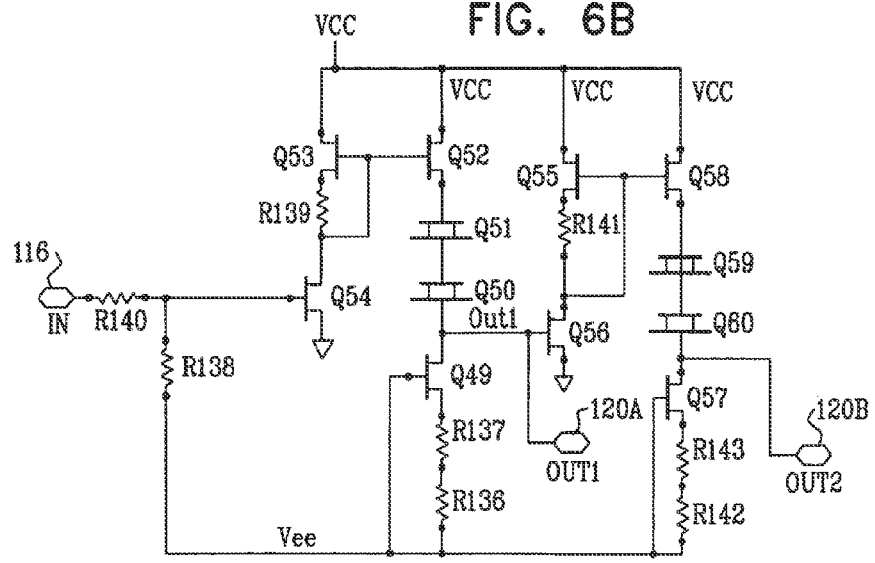
Figure 7:
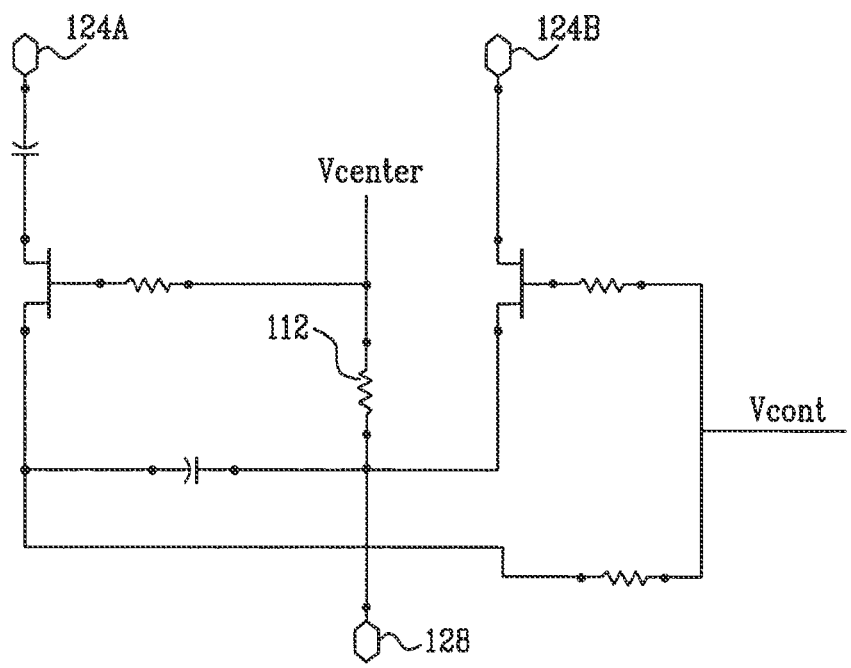

FIGS. 6A, 6B and 7 are circuit diagrams that schematically illustrate switching circuits that use a single control line per bit, in accordance with embodiments of the present invention. These switching circuits can be used to implement the internal switches that control the setting of phase shifters 44 and step-attenuators 52.

FIG. 6A shows a Single-Pole Double-Throw (SPDT) switch, which switches one of two RF input ports 96A and 96B to an RF output port 100. (The designation of inputs and outputs is arbitrary, and the same switch can switch an input RF signal at port 100 to one of ports 96A and 96B.) The circuit comprises two transistors 104A and 104B (e.g., pHEMT devices), and resistors 108A, 108B and 112.

When transistor 104A is switched on, an RF signal can pass between ports 96A and 100. Similarly, when transistor 104B is switched on, an RF signal can pass between ports 96B and 100. When a given transistor is switched off, its respective port is disconnected from port 100. Transistor 104A can be switched on and off by applying a control voltage denoted Vcont1 to its gate. Setting Vcont1 to a small positive voltage (e.g., +0.5V) causes transistor 104A to switch on. Setting Vcont1 to a negative voltage (e.g., −2V) causes transistor 104A to switch off. Transistor 104B can be controlled in a similar manner using a control voltage denoted Vcont2. Thus, operating the switching circuit involved supplying two opposite voltages to the circuit.

FIG. 6B shows a level shifting circuit, which receives as input a single control voltage at an input port 116, and produces two opposite output voltages at output ports 120A and 120B. Thus, the level shifting circuit of FIG. 6B can be operated in conjunction with the switching circuit of FIG. 6A, so as to provide one control line per bit. In such a configuration, outputs 120A and 120B of the circuit of FIG. 6B are connected to ports 96A and 96B of the circuit of FIG. 6A, respectively. Applying a single control voltage (e.g., a 2.5V logic control signal) to input port 116 will switch on one of transistors 104A and 104B, and switch off the other transistor, depending on the polarity of the control voltage.

In the circuit of FIG. 6B, the single control voltage switches a transistor Q54 on and off, depending on the control signal polarity. A transistor Q52 and diodes Q50 and Q51 perform level shifting, so as to produce the appropriate voltage level for driving the gate of transistor 104A in FIG. 6A. The voltage level for driving transistor 104B is produced similarly by a transistor Q58 and diodes Q59 and Q60.

FIG. 7 shows an alternative SPDT RF switch configuration, which operates on a single control voltage denoted Vcont. The circuit of FIG. 7 has an input port 128, which can be switched to one of two output ports 124A and 124B. (Again, the designation of ports as inputs or outputs is arbitrary, since the switch is bidirectional.) The circuit comprises two transistors. Each transistor can be switched on and off by applying two different voltage levels to its gate. Each transistor connects or disconnects the RF path between its respective output port and input port 128.

A fixed reference voltage denoted Vcenter is set to a median value between the two gate voltage levels. When Vcont is higher than Vcenter, port 124B is connected to port 128. When Vcont is lower than Vcenter, port 124A is connected to port 128.

Single-Die ASP Device Configuration

In some embodiments, both the RF circuitry and the digital control circuitry of the ASP device can be fabricated on a single semiconductor die. Such configurations enable the ASP device to be packaged in a single-die package.

FIG. 8 is a block diagram that schematically illustrates an ASP device 140, in accordance with an alternative embodiment of the present invention. Device 140 is similar in functionality to device 32 of FIG. 2 above. In the present embodiment, however, device 140 is fabricated on a single die 144 and packaged in a single-die package, as opposed to the MCM package used for packaging device 32.

Die 144 may comprise, for example, a Silicon-Germanium (SiGe) die, and the various elements of device 140 may be fabricated on the die using a SiGe Bi-polar CMOS (SiGE BiCMOS) process. In this embodiment, device 140 comprises two 24-bit shift registers 148, which are fabricated on die 144 along with the RF circuitry.

Although the embodiments described herein refers mainly to an ASP device that comprises four phase shifters for processing RF input signals from two dual-polarized antenna elements, similar devices can process RF input signals from four circularly-polarized antenna elements.

Although the embodiments described herein mainly address integrated analog signal processing devices for satellite antennas, the principles of the present invention can also be used in devices that serve other applications, such as phased array antennas used in cellular smart antenna applications, automotive radar and radiometry imaging applications.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A system, comprising:
   at least one antenna element;
   a preamplifier operative to receive one or more radio frequency (RF) input signals from the at least one antenna element;
   processing circuitry to receive the one or more RF input signals from the preamplifier via an RF input circuit; and
   biasing circuitry operative to produce one or more constant-current biasing signals for biasing the preamplifier with a predefined, constant current over the RF input circuit.

2. The system of claim 1, wherein the processing circuitry comprises a first programmable gain stage and a second programmable gain stage, the first programmable gain stage being configured to modify an amplitude of a first of the one or more RF input signals by a first factor, the second programmable gain stage being configured to modify an amplitude of a second of the one or more RF input signals by a second factor.

3. The system of claim 2, wherein the processing circuitry is configured to select the first factor and the second factor from a predefined set of non-uniformly-spaced factors.

4. The system of claim 2, wherein at least one of the first programmable gain stage and the second programmable gain stage is configured to be digitally controlled.

5. A device, comprising:
   at least one RF input conductor configured to receive a first radio frequency (RF) signal and a second RF signal from one or more preamplifiers;
   a first programmable gain stage configured to modify the first RF signal by a first predefined factor so as to produce a first modified RF signal;
   a second programmable gain stage, the second programmable gain stage being configured to modify the second RF signal by a second predefined factor so as to produce a second modified RF signal;
   a combiner circuit operative to combine the first modified RF signal and the second modified RF signal to produce an RF output signal; and
   biasing circuitry operative to produce one or more constant-current biasing signals for biasing the one or more preamplifiers with a predefined, constant current over the at least one RF input conductor.

6. The device of claim 5, comprising circuitry operative to select the first predefined factor and the second predefined factor from a predefined set of non-uniformly-spaced factors.

7. The device of claim 5, wherein the first programmable gain stage is configured to modify an amplitude of the first RF signal by the first predefined factor, and wherein the second programmable gain stage is configured to modify an amplitude of the second RF signal by the second predefined factor.

8. The device of claim 5, wherein at least one of the first programmable gain stage and the second programmable gain stage is configured to be digitally controlled.

9. A system, comprising:
   at least one antenna element operative to receive radio frequency (RF) signals;
   at least one preamplifier operative to amplify the RF signals to produce RF input signals and to output the RF input signals on one or more RF input conductors; and
   biasing circuitry operative to output constant-current biasing signals for biasing the at least one preamplifier with a predefined, constant current over at least one of the one or more RF input conductors.

10. The system of claim 9, comprising:
    a first programmable gain stage configured to modify a first of the RF input signals by a first factor so as to produce a first modified RF signal;
    a second programmable gain stage, the second programmable gain stage being configured to modify a second of the RF input signals by a second factor so as to produce a second modified RF signal; and
    a combiner circuit operative to combine the first modified RF signal and the second modified RF signal to produce an RF output signal.

11. The system of claim 10, comprising circuitry operative to select the first factor and the second factor from a predefined set of non-uniformly-spaced factors.

12. The system of claim 10, wherein the first programmable gain stage is configured to modify an amplitude of the first of the RF input signals by the first factor, and wherein the second programmable gain stage is configured to modify an amplitude of the second of the RF input signals by the second factor.

13. The system of claim 10, wherein at least one of the first programmable gain stage and the second programmable gain stage is configured to be digitally controlled.

14. A method, comprising:
    receiving a radio frequency (RF) signal from at least one antenna element;
    sending the RF signal to an amplifier;
    sending the RF signal from the amplifier to processing circuitry via at least one RF conductor; and
    biasing the amplifier using at least one constant-current biasing signal having a predefined, constant current, the at least one constant-current biasing signal received from the processing circuitry via the at least one RF conductor.

15. The method of claim 14, comprising modifying, by the processing circuitry, an amplitude of the RF signal by a factor.

16. The method of claim 15, comprising selecting, by the processing circuitry, the factor from a predefined set of non-uniformly-spaced factors.

17. The method of claim 15, wherein modifying the amplitude of the RF signal by the factor comprises utilizing a programmable gain stage to modify the amplitude of the RF signal by the factor, the method comprising digitally controlling the programmable gain stage to modify the amplitude of the RF signal by the factor.

* * * * *